(12) United States Patent
Ito

(10) Patent No.: US 8,042,560 B2
(45) Date of Patent: Oct. 25, 2011

(54) SUBSTRATE PROCESSING APPARATUS

(75) Inventor: Norihiro Ito, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 540 days.

(21) Appl. No.: 12/219,312

(22) Filed: Jul. 18, 2008

(65) Prior Publication Data

US 2009/0031948 A1 Feb. 5, 2009

(30) Foreign Application Priority Data

Jul. 31, 2007 (JP) .................................. 2007-198826

(51) Int. Cl.
*B08B 3/00* (2006.01)

(52) U.S. Cl. ............................ 134/137; 427/240; 118/52

(58) Field of Classification Search .......................... None
See application file for complete search history.

(56) References Cited

U.S. PATENT DOCUMENTS

| 5,688,322 | A | 11/1997 | Motoda et al. |
| 5,718,763 | A | 2/1998 | Tateyama et al. |
| 6,447,608 | B1 | 9/2002 | Sakai et al. |
| 2004/0180141 | A1 | 9/2004 | Kobayashi et al. |
| 2004/0180142 | A1 | 9/2004 | Kobayashi et al. |

FOREIGN PATENT DOCUMENTS

| JP | 5-146736 | 6/1993 |
| JP | 08-001064 | 1/1996 |
| JP | 2000-138163 | 5/2000 |
| JP | 2000-315671 | 11/2000 |
| JP | 2001-212493 | 8/2001 |
| JP | 2002-368066 | 12/2002 |
| JP | 2003-264167 | 9/2003 |

OTHER PUBLICATIONS

Office Action mailed on Nov. 16, 2010, in Japanese Patent Application No. 2006-207044 (with partial translation).
Japanese Office Action issued on May 17, 2011 for Application No. 2007-198826 with English translation.

*Primary Examiner* — Michael Barr
*Assistant Examiner* — Jason Ko
(74) *Attorney, Agent, or Firm* — Smith, Gambrell & Russell, LLP

(57) ABSTRACT

A substrate processing apparatus includes a rotary cup disposed outside a substrate holding member to surround a substrate held on the substrate holding member and to rotate along with the substrate holding member, and having a wall portion that receives a process liquid thrown off from the substrate being rotated. Further, this apparatus includes an exhaust and drain cup disposed outside the rotary cup to surround the rotary cup and the substrate holding member, and including an annular liquid receptacle that receives the process liquid thrown off from the substrate being rotated and an inner annular space formed on an inward side from the annular liquid receptacle. An exhaust mechanism is connected to the inner annular space of the exhaust and drain cup.

6 Claims, 14 Drawing Sheets

SUBSTRATE PROCESSING APPARATUS

BACKGROUND OF THE INVENTION

1. Field of the Invention

The present invention relates to a substrate processing apparatus for performing a predetermined liquid process, such as a cleaning process, on a substrate, such as a semiconductor wafer.

2. Description of the Related Art

In the process of manufacturing semiconductor devices or flat panel display devices (FPD), liquid processes are frequently used, in which a process liquid is supplied onto a target substrate, such as a semiconductor wafer or glass substrate. For example, a process of this kind is a cleaning process for removing particles and/or contaminants deposited on a substrate.

As a substrate processing apparatus used for this purpose, there is known an apparatus that performs a cleaning process on a substrate, such as a semiconductor wafer, held on a spin chuck, in which a process liquid, such as a chemical liquid, is supplied onto the substrate, while the substrate is rotated. In general, according to apparatuses of this kind, a process liquid is supplied onto the center of a substrate, and the substrate is rotated to spread the process liquid outward, thereby forming a liquid film and throwing off the process liquid out of the substrate. After the cleaning process, a rinsing process is performed, such that a rinsing liquid, such as purified water, is supplied onto the substrate, while the substrate is rotated in a similar way, thereby forming a liquid film of the rinsing liquid and throwing off the rinsing liquid out of the substrate. In light of this, there is proposed a structure in which a drain cup is disposed to surround a substrate and to receive and discharge a process liquid or rinsing liquid thrown off outward from the substrate (for example, Jpn. Pat. Appln. KOKAI Publication No. 2002-368066).

According to this substrate processing apparatus, a substrate is rotated to throw off the process liquid or rinsing liquid outward from the substrate by a centrifugal force, while gas is exhausted from around the substrate, so that the process liquid or rinsing liquid is collected.

However, if the exhaust power is insufficient, mist is generated above the substrate and particles are thereby deposited on the substrate.

BRIEF SUMMARY OF THE INVENTION

An object of the present invention is to provide a substrate processing apparatus that can prevent mist from being generated above the substrate.

According to a first aspect of the present invention, there is provided a substrate processing apparatus comprising: a substrate holding member configured to rotate along with a substrate held thereon in a horizontal state; a rotation mechanism configured to rotate the substrate holding member; a process liquid supply mechanism configured to supply a process liquid onto the substrate; a rotary cup disposed outside the substrate holding member to surround the substrate held on the substrate holding member and to rotate along with the substrate holding member, and having a wall portion that receives the process liquid thrown off from the substrate being rotated; an exhaust and drain cup disposed outside the rotary cup to surround the rotary cup and the substrate holding member, and including an annular liquid receptacle that receives the process liquid thrown off from the substrate being rotated and an inner annular space formed on an inward side from the annular liquid receptacle; and an exhaust mechanism connected to the inner annular space of the exhaust and drain cup.

According to a second aspect of the present invention, there is provided a substrate processing apparatus comprising: a substrate holding member configured to rotate along with a substrate held thereon in a horizontal-state; a rotation mechanism configured to rotate the substrate holding member; a process liquid supply mechanism configured to supply a process liquid onto the substrate; a rotary cup disposed outside the substrate holding member to surround the substrate held on the substrate holding member and to rotate along with the substrate holding member, and having a wall portion that receives the process liquid thrown off from the substrate being rotated; an exhaust cup disposed outside the rotary cup to surround the rotary cup and the substrate holding member, and including a bottom wall, an annular outer wall disposed along a periphery of the bottom wall, and an annular inner wall disposed on an inward side from the annular outer wall; a drain cup disposed inside the exhaust cup to surround the rotary cup and the substrate holding member, such that a lower annular space is formed between the drain cup and the bottom wall of the exhaust cup, an outer annular space is formed between the drain cup and the annular outer wall of the exhaust cup, and an inner annular space is formed between the drain cup and the annular inner wall of the exhaust cup, the drain cup including an annular liquid receptacle that receives the process liquid thrown off from the substrate being rotated; an exhaust mechanism connected to the lower annular space; and a gas-flow adjusting member disposed between the outer annular space and the lower annular space, wherein at least one ventilation hole is formed through a portion of the drain cup off the liquid receptacle above the lower annular space and opened to a position adjacent to the substrate holding member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawings. In the following description, an explanation will be given of a case where the present invention is applied to a liquid processing apparatus that can perform a cleaning process on the front and back surfaces of a semiconductor wafer (which will be simply referred to as "wafer", hereinafter).

Figure 1:
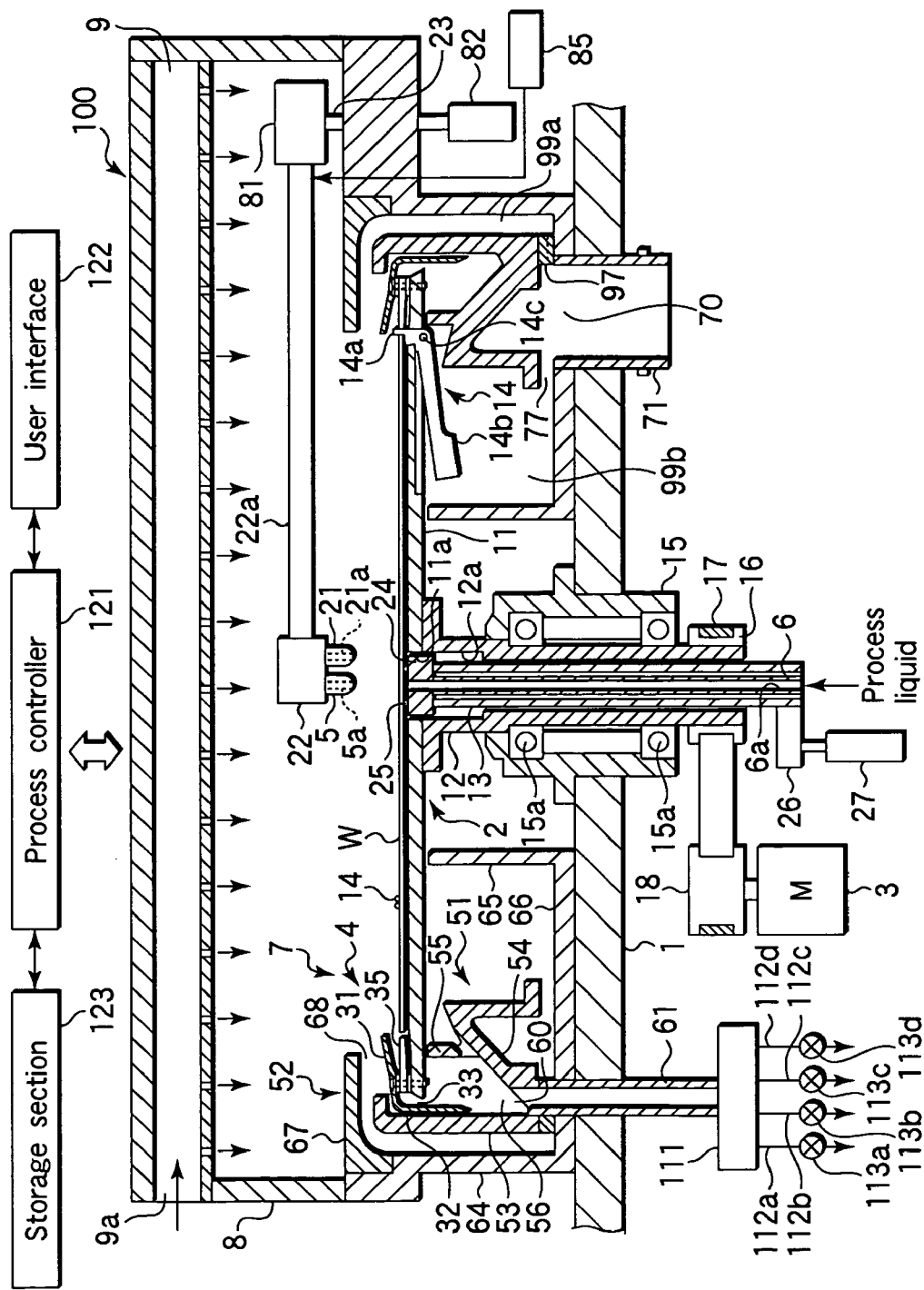
FIG. 1 is a sectional view schematically showing the structure of a substrate processing apparatus according to an embodiment of the present invention.
Figure 2:
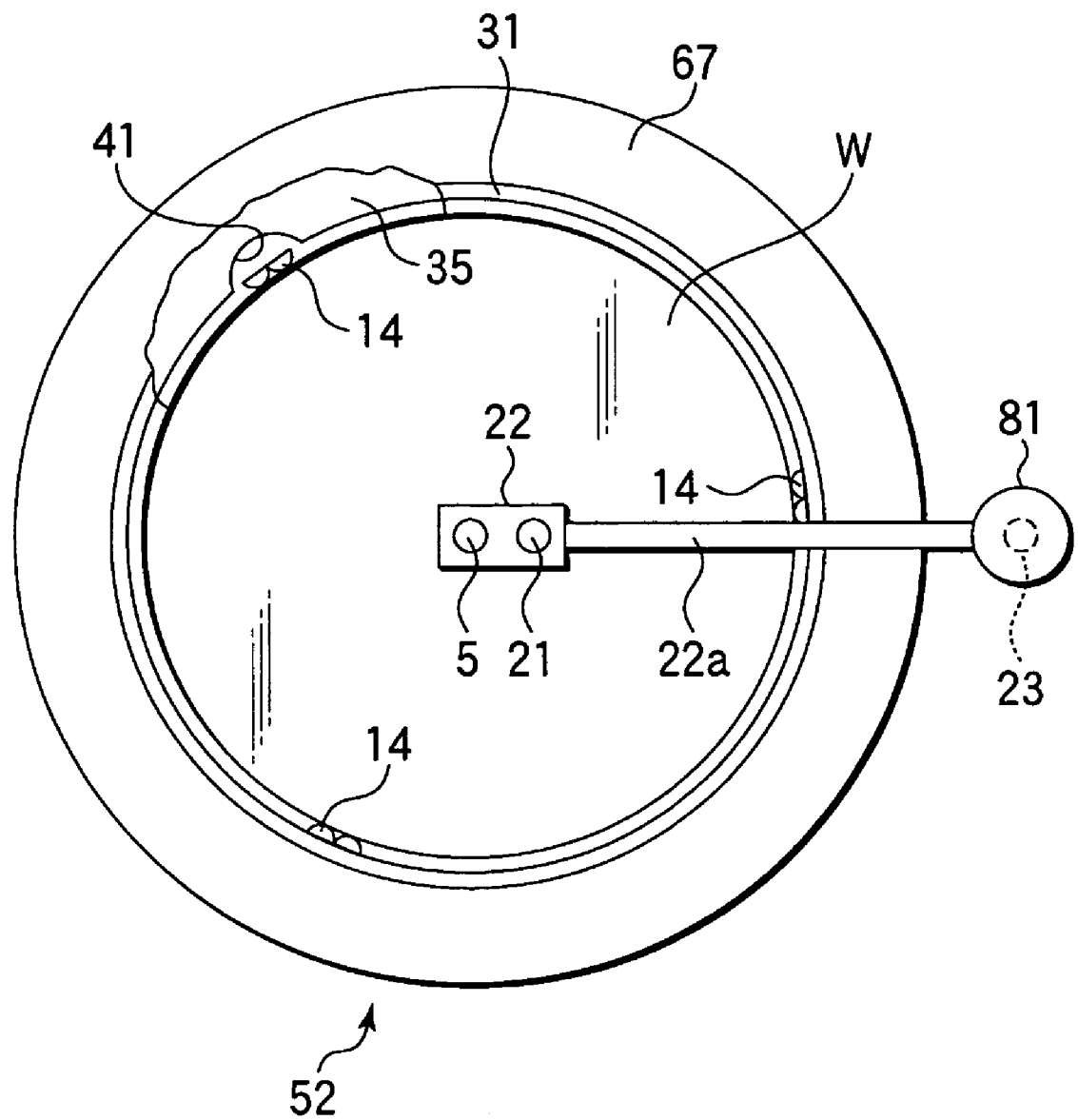
FIG. 2 is a partially sectional plan view schematically showing the substrate processing apparatus according to an embodiment of the present invention.
Figure 3:
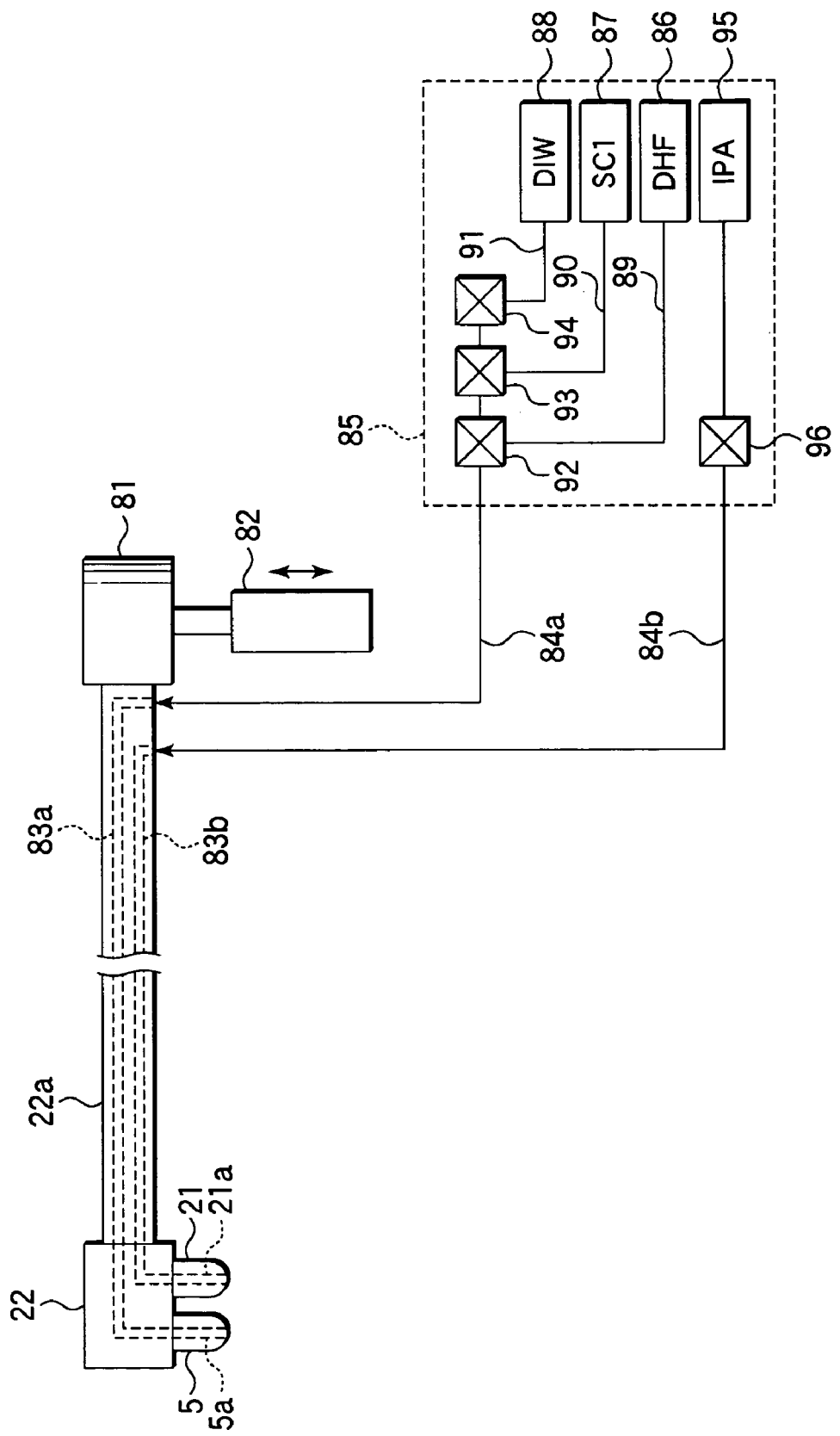
FIG. 3 is a view schematically showing a liquid supply mechanism used in the substrate processing apparatus shown in FIG. 1.
Figure 4:
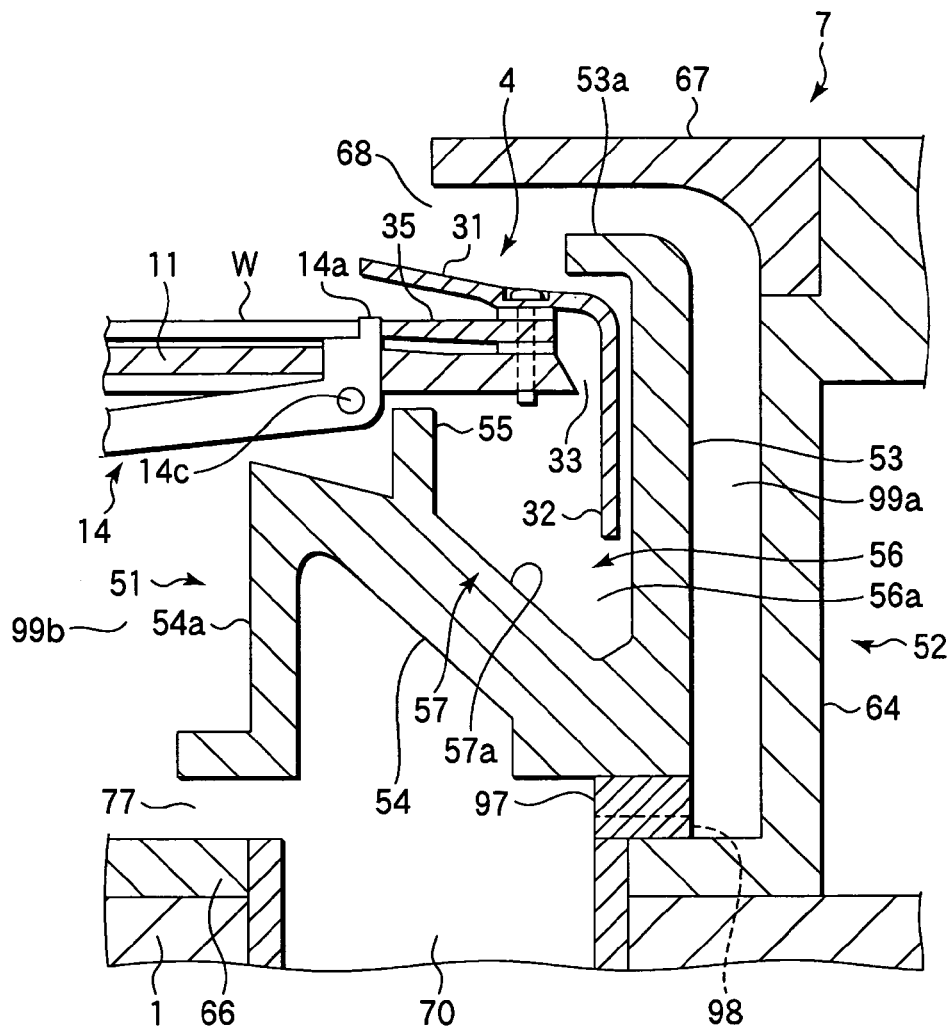
FIG. 4 is an enlarged sectional view showing an exhaust/drain section used in the substrate processing apparatus shown in FIG. 1.

FIG. 1 is a sectional view schematically showing the structure of a substrate processing apparatus according to an embodiment of the present invention. FIG. 2 is a plan view of the apparatus shown in FIG. 1. FIG. 3 is a view schematically showing a process liquid supply mechanism and a rinsing liquid supply mechanism used in the substrate processing apparatus shown in FIG. 1. FIG. 4 is an enlarged sectional view showing an exhaust/drain section used in the substrate processing apparatus shown in FIG. 1.

A liquid processing system (not shown) contains a plurality of apparatuses disposed therein, each of which is the same as this substrate processing apparatus 100. As shown in FIG. 1 and FIG. 2, this substrate processing apparatus 100 includes a base plate 1 and a wafer holding member 2 for rotatably holding a target substrate or wafer W. The wafer holding member 2 is rotatable by a rotary motor 3. A rotary cup 4 is disposed to surround the wafer W held on the wafer holding member 2 and configured to rotate along with the wafer holding member 2. The substrate processing apparatus 100 further includes a front side liquid supply nozzle 5 for supplying a process liquid onto the front surface of the wafer W, and a back side liquid supply nozzle 6 for supplying a process liquid onto the back surface of the wafer W. Further, an exhaust/drain section 7 is disposed around the rotary cup 4. A casing 8 is disposed to cover the area around the exhaust/drain section 7 and the area above the wafer W. The casing 8 is provided with a gas flow inlet section 9 at the top, which is arranged to receive, through an inlet port 9a formed on a lateral side, a gas flow supplied from a fan/filter unit (FFU) 9 of the liquid processing system, so that clean air is supplied as a down flow onto the wafer W held on the wafer holding member 2.

The wafer holding member 2 includes a rotary plate 11 formed of a circular plate set in a horizontal state. The center of the bottom of the rotary plate 11 is connected to a cylindrical rotary shaft 12 extending vertically downward. The rotary plate 11 has a circular opening 11a at the center, which communicates with a bore 12a formed inside the rotary shaft 12. An elevating member 13 supporting the back side liquid supply nozzle 6 is movable up and down through the bore 12a and opening 11a. As shown in FIG. 2, the rotary plate 11 is provided with three holding accessories 14 disposed at regular intervals for holding the outer edge of the wafer W. The holding accessories 14 are configured to hold the wafer W in a horizontal state such that the wafer W is slightly separated from the rotary plate 11. Each of the holding accessories 14 includes a holding portion 14a configured to hold the edge of the wafer W, an operation lever 14b extending from the holding portion 14a toward the center of the lower surface of the rotary plate, and a pivot shaft 14c that supports the holding portion 14a to be vertically rotatable. When the distal end of the operation lever 14b is pushed up by a cylinder mechanism (not shown), the holding portion 14a is rotated outward and cancels the hold on the wafer W. Each holding accessory 14 is biased by a spring (not shown) toward a direction for the holding portion 14a to hold the wafer W, so that the holding accessory 14 can hold the wafer W when the cylinder mechanism does not act thereon.

The rotary shaft 12 is rotatably supported by the base plate 1 through a bearing mechanism 15 having two bearings 15a. The rotary shaft 12 is provided with a pulley 16 fitted thereon at the lower end. The shaft of the motor 3 is also provided with a pulley 18 fitted thereon. A belt 17 is wound around between these pulleys 16 and 18. The rotary shaft 12 is rotated through the pulley 18, belt 17, and pulley 16 by rotation of the motor 3.

The front side liquid supply nozzle 5 is attached to a nozzle holding member 22 supported on the distal end of a nozzle arm 22a. A process liquid or the like is supplied from a liquid supply mechanism 85 described later through a flow passage formed in the nozzle arm 22a, and is then delivered from a nozzle hole 5a formed in the nozzle 5. For example, the process liquid thus delivered encompasses a chemical liquid for wafer cleaning, a rising liquid such as purified water, and so forth. The nozzle holding member 22 is further provided with a drying solvent nozzle 21 attached thereon for delivering a drying solvent, such as IPA. A drying solvent, such as IPA, is delivered from a nozzle hole 21a formed in the nozzle 21.

As shown in FIG. 2, the nozzle arm 22a is rotatable by a driving mechanism 81 about a shaft 23 used as a central axis to move the front side liquid supply nozzle 5 between wafer cleaning positions above the center and periphery of the wafer W and a retreat position outside the wafer W. Further, the nozzle arm 22a is movable up and down by an elevating mechanism 82, such as a cylinder mechanism.

As shown in FIG. 3, the nozzle arm 22a has a flow passage 83a formed therein and connected at one end to the nozzle hole 5a of the front side liquid supply nozzle 5. The other end of the flow passage 83a is connected to a tube 84a. The nozzle arm 22a further has a flow passage 83b formed therein and connected at one end to the nozzle hole 21a of the drying solvent nozzle 21. The other end of the flow passage 83b is connected to a tube 84b. Predetermined process liquids are supplied through the tubes 84a and 84b from the liquid supply mechanism 85. The liquid supply mechanism 85 includes cleaning chemical liquid sources, such as a DHF supply source 86 for supplying dilute hydrofluoric acid (DHF) as an acidic chemical liquid and an SC1 supply source 87 for supplying ammonia hydrogen peroxide solution (SC1) as an alkaline chemical liquid. The liquid supply mechanism 85 further includes a rinsing liquid source, such as a DIW supply source 88 for supplying purified water (DIW) and a drying solvent source, such as an IPA supply source 95 for supplying IPA. The DHF supply source 86, SC1 supply source 87, and DIW supply source 88 are connected to tubes 89, 90, and 91 extending therefrom. The tubes 89, 90, and 91 are connected to the tube 84*a* through switching valves 92, 93, and 94. Accordingly, ammonia hydrogen peroxide solution (SC1), dilute hydrofluoric acid (DHF), and purified water (DIW) are selectively supplied to the front side liquid supply nozzle 5 by operating the switching valves 92, 93, and 94. In this case, the tube 91 extending from the DIW supply source 88 is connected to the most upstream side of the tube 84*a*. On the other hand, the IPA supply source 95 is directly connected to the tube 84*b* extending from the flow passage 83*b* and provided with a switching valve 96 thereon. Accordingly, IPA is supplied to the drying solvent nozzle 21 by opening the switching valve 96.

As described above, the liquid supply mechanism 85 serves as a process liquid supply mechanism for supplying ammonia hydrogen peroxide solution (SC1) and dilute hydrofluoric acid (DHF) used as cleaning process liquids. The liquid supply mechanism 85 also serves as a rinsing liquid supply mechanism for supplying purified water (DIW) used as a rinsing liquid. The liquid supply mechanism 85 further serves as a drying solvent supply mechanism for supplying IPA used as a drying solvent.

The back side liquid supply nozzle 6 has a nozzle hole 6*a* formed through the center of the elevating member 13 and extending in the longitudinal direction. A predetermined process liquid is supplied from a process liquid supply mechanism (not shown) into the nozzle hole 6*a* from below and is then delivered from the nozzle hole 6*a* onto the back surface of the wafer W. For example, the process liquid thus delivered encompasses a cleaning process liquid, a rising liquid such as purified water, and so forth, as in the front side liquid supply nozzle 5. The liquid supply mechanism for supplying a process liquid into the back side liquid supply nozzle 6 may be structured as in the liquid supply mechanism 85 except for the IPA supply circuit. The elevating member 13 includes a wafer support head 24 at the top for supporting the wafer W. The wafer support head 24 is provided with three wafer support pins 25 for supporting the wafer W (only two of them are shown) on the upper surface. The lower end of the back side liquid supply nozzle 6 is connected to a cylinder mechanism 27 through a connector 26. The elevating member 13 is movable up and down by the cylinder mechanism 27 to move up and down the wafer W in loading and unloading the wafer W.

The rotary cup 4 includes an annular eaves portion 31 inclined to extend inward and upward from a position above the end of the rotary plate 11 and a cylindrical wall portion 32 extending vertically downward from the outer end of the eaves portion 31. As shown in the enlarged view of FIG. 4, an annular gap 33 is formed between the wall portion 32 and rotary plate 11, so that the process liquid or rinsing liquid scattered by rotation of the wafer W along with the rotary plate 11 and rotary cup 4 is guided downward through the gap 33.

Figure 5:
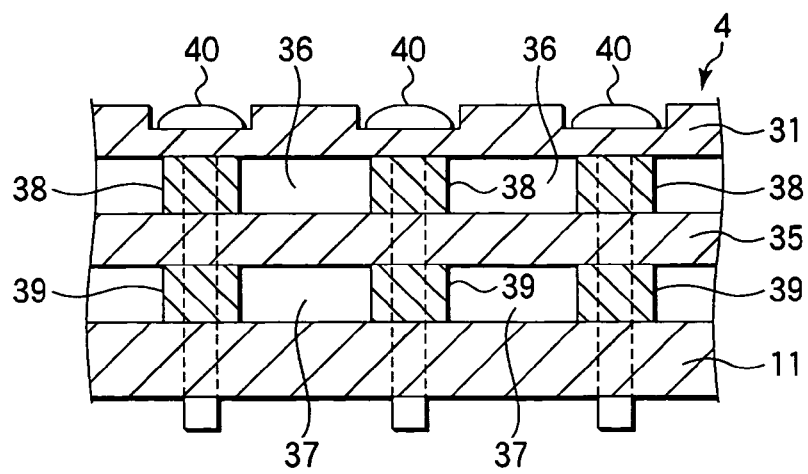
FIG. 5 is a view for explaining the arrangement of a rotary cup and a guide member used in the substrate processing apparatus shown in FIG. 1.

A plate-like rotary guide 35 is disposed between the eaves portion 31 and rotary plate 11 at a height essentially the same as the wafer W. As shown in FIG. 5, a plurality of spacers 38 and 39 are disposed in an annular direction between the eaves portion 31 and rotary guide 35 and between the rotary guide 35 and rotary plate 11 to form openings 36 and 37 for allowing the process liquid or rinsing liquid to pass therethrough. The eaves portion 31, rotary guide 35, rotary plate 11, and spacers 38 and 39 are fixed to each other by screws 40.

The rotary guide 35 is arranged such that the upper and lower surfaces thereof are to be almost continued to the front and back surfaces of the wafer W. When a process liquid is supplied onto the center of the front surface of the wafer W from the front side liquid supply nozzle 5 while the wafer holding member 2 and rotary cup 4 are rotated along with the wafer W by the motor 3, the process liquid is spread by a centrifugal force on the front surface of the wafer W and is thrown off from the peripheral edge of the wafer W. The process liquid thus thrown off from the front surface of the wafer W is guided by the upper surface of the rotary guide 35. Then, the process liquid is discharged outward through the openings 36, and is guided downward by the wall portion 32. Similarly, when a process liquid is supplied onto the center of the back surface of the wafer W from the back side liquid supply nozzle 6 while the wafer holding member 2 and rotary cup 4 are rotated along with the wafer W, the process liquid is spread by a centrifugal force on the back surface of the wafer W and is thrown off from the peripheral edge of the wafer W. The process liquid thus thrown off from the back surface of the wafer W is guided by the lower surface of the rotary guide 35 almost continued thereto. Then, the process liquid is discharged outward through the openings 37, and is guided downward by the wall portion 32. At this time, since a centrifugal force acts on the process liquid guided to the spacers 38 and 39 and wall portion 32, mist of the process liquid is inhibited from returning inward.

Further, since the process liquid thrown off from the front and back surfaces of the wafer W is guided by the rotary guide 35, the process liquid separated from the peripheral edge of the wafer W can hardly become turbulent. In this case, it is possible to guide the process liquid out of the rotary cup 4 while preventing the process liquid from being turned into mist. As shown in FIG. 2, the rotary guide 35 has notches 41 at positions corresponding to the wafer holding accessories 14 to accept the wafer holding accessories 14.

The exhaust/drain section 7 is mainly used for collecting exhaust gas and drainage discharged from the space surrounded by the rotary plate 11 and rotary cup 4. As shown in the enlarged view of FIG. 4, the exhaust/drain section 7 includes an annular drain cup 51 disposed to receive the process liquid or rinsing liquid discharged from the rotary cup 4, and an annular exhaust cup 52 accommodating the drain cup 51 and disposed coaxially with the drain cup 51.

As shown in FIGS. 1 and 4, the drain cup 51 includes a cylindrical outer sidewall 53 vertically disposed outside the rotary cup 4 adjacent to the wall portion 32, and an internal wall 54 extending inward from the lower end of the outer sidewall 53. The internal wall 54 is connected to an inner sidewall 54*a* vertically disposed on the inner side. The outer sidewall 53 and internal wall 54 define an annular space used as a liquid receptacle 56 for receiving the process liquid or rinsing liquid discharged from the rotary cup 4. The upper side of the outer sidewall 53 is formed as an extending portion 53*a* extending to a position above the rotary cup 4 to prevent the process liquid from bouncing out from the drain cup 51. The liquid receptacle 56 includes an annular partition wall 55 disposed therein in an annular direction of the drain cup 51 outside the holding accessories 14 and extending from the internal wall 54 to a position near the lower surface of the rotary plate 11. The partition wall 55 serves to prevent stray winds, generated by the portions of the holding accessories 14 protruding downward below the rotary plate 11, from involving and transferring mist onto the wafer W.

The drain cup 51 has a drain port 60 for drainage from the liquid receptacle 56, which is formed in the internal wall 54 at one position on the outermost side and connected to a drain tube 61 (see FIG. 1). The drain tube 61 is provided with a drain-switching member 111, which is connected to an acid discharge tube 112*a* for discharging acidic drainage, an alkali discharge tube 112*b* for discharging alkaline drainage, an acid collection tube 112c for collecting the acidic chemical liquid, and an alkali collection tube 112d for collecting the alkaline chemical liquid, all of them extending vertically downward. The acid discharge tube 112a, alkali discharge tube 112b, acid collection tube 112c, and alkali collection tube 112d are respectively provided with valves 113a, 113b, 113c, and 113d. With this arrangement, the process liquids are separately collected or discarded in accordance with the types thereof. More specifically, when cleaning is performed by use of dilute hydrofluoric acid (DHF), the drain-switching member 111 is switched to the acid collection tube 112c to collect drainage of the dilute hydrofluoric acid (DHF). When a rinsing process is performed after the cleaning using the dilute hydrofluoric acid (DHF), the drain-switching member 111 is switched to the acid discharge tube 112a to discard drainage of the dilute hydrofluoric acid (DHF) mixed with the rinsing liquid. Further, when cleaning is performed by use of ammonia hydrogen peroxide solution (SC1), the drain-switching member 111 is switched to the alkali collection tube 112d to collect drainage of the ammonia hydrogen peroxide solution (SC1). When a rinsing process is performed after the cleaning using the ammonia hydrogen peroxide solution (SC1), the drain-switching member 111 is switched to the alkali discharge tube 112b to discard drainage of the ammonia hydrogen peroxide solution (SC1) mixed with the rinsing liquid. In place of a single drain port 60, a plurality of drain ports 60 may be formed.

When the rotary plate 11 and rotary cup 4 are rotated along with the wafer W, the process liquid or rinsing liquid discharged and received from the rotary cup 4 generates a circular flow inside the drain cup 51 and is drained through the drain port 60 to the drain tube 61. The circular flow may be generated only by rotation of the rotary plate 11 along with the wafer W. However, in this embodiment, the lower side of the wall portion 32 is inserted into the drain cup 51 to generate a circular gas flow when the rotary cup 4 is rotated. In this case, the process liquid or rinsing liquid accompanies the circular gas flow inside the drain cup 51, and generates a circular flow with a higher velocity as compared to a circular flow generated only by rotation of the wafer W and rotary plate 11. Consequently, the liquid is discharged from the drain port 60 more swiftly.

The exhaust cup 52 includes an outer wall (annular outer wall portion) 64 vertically extending outside the vertical wall 53 of the drain cup 51, and an inner wall (annular inner wall portion) 65 disposed on the inward side from the holding accessories 14 and vertically extending to have an upper end adjacent to the rotary plate 11. The exhaust cup 52 further includes a bottom wall (bottom wall portion) 66 placed on the base plate 1, and a top wall 67 extending upward and curved from the outer wall 64 to cover an area above the rotary cup 4. The exhaust cup 52 is mainly used for collecting and exhausting gas components from inside and around the rotary cup 4 through an annular inlet port 68 formed between the top wall 67 and eaves portion 31 of the rotary cup 4. As shown in FIGS. 1 and 4, the exhaust cup 52 has exhaust ports 70 formed in the bottom and each connected to an exhaust tube 71. The exhaust tube 71 is connected to a suction mechanism (not shown) on the downstream side, so that gas is exhausted from around the rotary cup 4.

An outer annular space 99a is formed between the outer wall or outer sidewall 53 of the drain cup 51 and the outer wall 64 of the exhaust cup 52. An annular gas flow adjusting member 97 is disposed between the bottom of the drain cup 51 and the bottom of the exhaust cup 52 outside the exhaust ports 70. The gas flow adjusting member 97 has a number of gas-flow holes 98 formed therein and arrayed in an annular direction. The outer annular space 99a and gas-flow adjusting member 97 serve to adjust a gas flow collected in the exhaust cup 52 so as to uniformly discharge it from the exhaust ports 70. Specifically, this exhaust gas flow is guided downward through the annular space or outer annular space 99a uniformly all over an annular direction, and is then supplied with a pressure loss or resistance by the gas flow adjusting member 97 having a number of gas-flow holes 98. Consequently, the gas flow is distributed and is relatively uniformly discharged to the exhaust ports 70 from all around, regardless of the distance from the exhaust ports 70.

On the other hand, an inner annular space 99b is formed between the inner sidewall 54a of the drain cup 51 and the inner wall 65 of the exhaust cup 52. Further, a gap 77 is formed between the drain cup 51 and the bottom wall of the exhaust cup 52 on the inner peripheral side of the drain cup 51. Gas components collected through the inlet port 68 partly flow into the liquid receptacle 56 of the drain cup 51, as well as the outer annular space 99a. This gas flow is guided downward through the liquid receptacle 56 and inner annular space 99b uniformly all over an annular direction, and is relatively uniformly discharged through the gap 77 to the exhaust ports 70.

As described above, the liquid-draining from the drain cup 51 is performed independently of the gas-exhausting from the exhaust cup 52, so that drainage and exhaust gas are guided separately from each other. Further, since the exhaust cup 52 is disposed to surround the drain cup 51, mist leaked out of the drain cup 51 is swiftly discharged from the exhaust ports 70, so that the mist is reliably prevented from diffusing outside.

The substrate processing apparatus 100 includes a process controller 121 comprising a microprocessor (computer), which is connected to and controls the respective components of the substrate processing apparatus 100. The process controller 121 is connected to the user interface 122, which includes, e.g., a keyboard and a display, wherein the keyboard is used for a process operator to input commands for operating the respective components of the substrate processing apparatus 100, and the display is used for showing visualized images of the operational status of the respective components of the substrate processing apparatus 100. Further, the process controller 121 is connected to a storage section 123 that stores recipes, i.e., control programs for the process controller 121 to control the substrate processing apparatus 100 so as to perform various processes, and control programs for the respective components of the substrate processing apparatus 100 to perform predetermined processes in accordance with process conditions. The recipes are stored in a storage medium included in the storage section 123. The storage medium may be formed of a medium of the stationary type, such as a hard disk or semiconductor memory, or a medium of the portable type, such as a CDROM, DVD, or flash memory. Alternatively, the recipes may be used online while they are transmitted from another apparatus through, e.g., a dedicated line, as needed.

A required recipe is retrieved from the storage section 123 and executed by the process controller 121 in accordance with an instruction or the like input through the user interface 122. Consequently, the substrate processing apparatus 100 can perform a predetermined process under the control of the process controller 121.

Next, with reference to FIGS. 6A to 8, an explanation will be given of an operation of the substrate processing apparatus 100 having the structure described above. The operation described below for performing a cleaning process according to this embodiment is controlled by the process controller 121 in accordance with a recipe stored in the storage section 123.

Figure 6A:
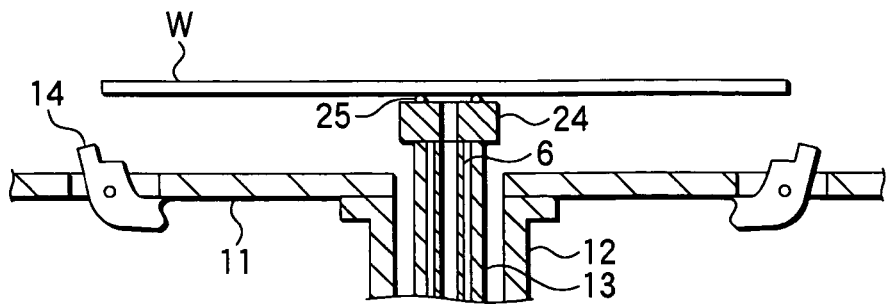
FIGS. 6A to 6D are views for explaining the operation of a cleaning process performed by the substrate processing apparatus according to an embodiment of the present invention.
Figure 6B:
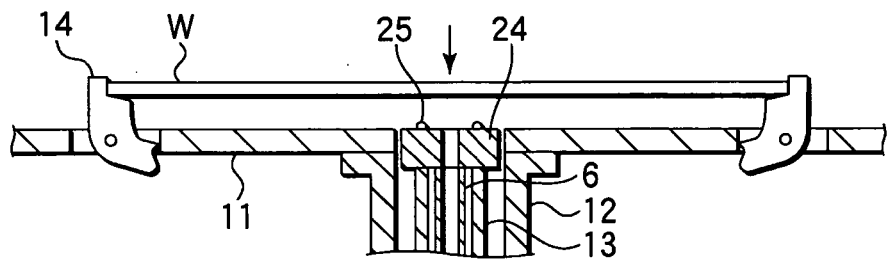
Figure 6C:
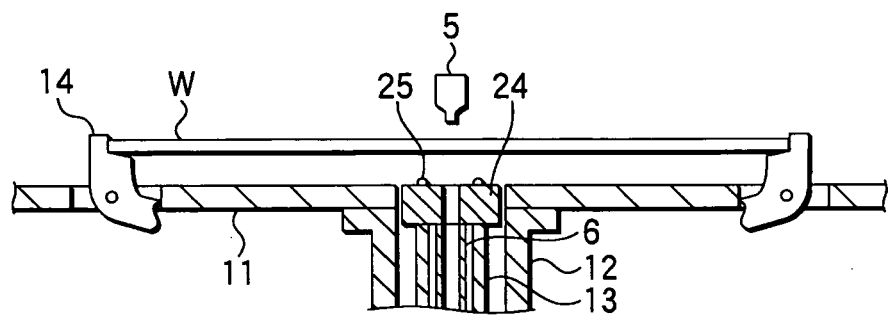

In the cleaning process using a process liquid (chemical liquid), at first, as shown in FIG. 6A, the elevating member 13 is set at the upper position, and a wafer W is transferred from a transfer arm (not shown) onto the support pins 25 of the wafer support head 24. Then, as shown in FIG. 6B, the elevating member 13 is moved down to a position where the wafer W can be held by the holding accessories 14, and then the wafer W is chucked by the holding accessories 14. Then, as shown in FIG. 6C, the front side liquid supply nozzle 5 is moved from the retreat position to the wafer cleaning position.

Figure 6D:
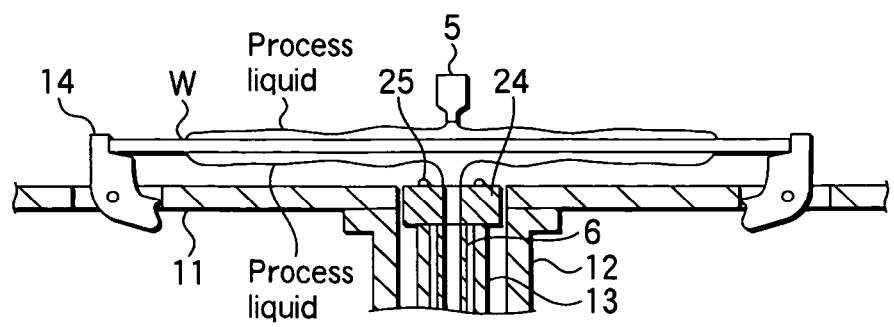

In this state, as shown in FIG. 6D, while the holding member 2 is rotated along with the rotary cup 4 and wafer W by the motor 3, a predetermined process liquid is supplied from the front side liquid supply nozzle 5 and back side liquid supply nozzle 6 to perform a cleaning process.

In this wafer cleaning process, while the wafer W is rotated, the process liquid is supplied from the front side liquid supply nozzle 5 and back side liquid supply nozzle 6 onto the center of the front surface and back surface of the wafer W. Consequently, the process liquid is spread outward by a centrifugal force on the wafer W, while applying a cleaning action onto the wafer W. The process liquid used for the cleaning action is then thrown off from the peripheral edge of the wafer W. In the cleaning process, the rotational speed of the wafer is preferably set to be 200 to 700 rpm. The flow rate of the process liquid is preferably set to be 0.5 to 1.5 L/min.

The cup surrounding the wafer W used in this wafer cleaning process is the rotary cup 4 that is rotated along with the wafer W. Accordingly, when the process liquid thrown off from the wafer W hits against the rotary cup 4, a centrifugal force acts on the process liquid, and the process liquid is thereby inhibited from being scattered (turned into mist), unlike a case where a stationary cup is used for the same purpose. Then, the process liquid is guided downward by the rotary cup 4, and is discharged through the gap 33 into the main cup portion 56a of the liquid receptacle 56 of the drain cup 51. The process liquid received by the drain cup 51 is discharged through the drain port 60 to the drain tube 61, while it is circulated inside the drain cup 51. At this time, along with rotation of the rotary cup 4, a circular gas flow is generated by the wall portion 32 inside the drain cup 51, and the process liquid accompanies the circular gas flow inside the drain cup 51. Consequently, when the process liquid is discharged through the drain port 60 to the drain tube 61, the process liquid generates a circular flow with a higher velocity inside the drain cup 51. Since such a circular flow with a higher velocity is generated, the process liquid is discharged through the drain port 60 to the drain tube 61 in a shorter time.

Further, gas components are mainly collected into the exhaust cup 52 from inside and around the rotary cup 4 through the annular inlet port 68 formed between the top wall 67 and eaves portion 31 of the rotary cup 4, and are then exhausted through the exhaust ports 70 to the exhaust tube 71.

After the cleaning process using a process liquid is performed, as described above, a rinsing process is sequentially performed. In this rinsing process, supply of the process liquid is stopped, and purified water is supplied as a rinsing liquid from the front side liquid supply nozzle 5 and back side liquid supply nozzle 69 onto the front and back surfaces of the wafer W. At this time, as in the cleaning process using a process liquid, while the holding member 2 is rotated along with the rotary cup 4 and wafer W by the motor 3, purified water used as a rinsing liquid is supplied from the front side liquid supply nozzle 5 and back side liquid supply nozzle 6 onto the center of the front and back surfaces of the wafer W. Consequently, the rinsing liquid is spread outward by a centrifugal force on the wafer W, while applying a rinsing action onto the wafer W. The purified water used for the rinsing action is then thrown off from the peripheral edge of the wafer W.

As in the process liquid, the purified water or rinsing liquid thus thrown off is discharged through the gap 33 of the rotary cup 4 and the openings that accept the holding portions 14a into the liquid receptacle 56 of the drain cup 51. Then, the purified water or rinsing liquid is discharged through the drain port 60 to the drain tube 61 while it is circulated inside the drain cup 51. At this time, a circular gas flow is generated by the wall portion 32 of the rotary cup 4 inside the drain cup 51, and the purified water or rinsing liquid accompanies the circular gas flow inside the drain cup 51. Consequently, a circular flow with a higher velocity is generated, and so the purified water or rinsing liquid is discharged through the drain port 60 to the drain tube 61 in a shorter time.

As described above, since the process liquid or rinsing liquid is discharged from the annular drain cup 51 in a shorter time, the liquid replacing rate can be increased, where a plurality of process liquids are used. In addition, when process liquids of different types are switched, they are prevented from being mixed with each other when they are discharged.

When the rinsing process using purified water as a rinsing liquid is performed on the wafer W, the purified water thrown off from the wafer W is circulated inside the drain cup 51 and applies a cleaning action onto the interior of the drain cup 51.

As described above, the substrate processing apparatus 100 according to this embodiment includes various countermeasures for preventing mist generation. Further, a substrate processing apparatus 100 according to an embodiment includes features made in light of gas flows at the periphery of the wafer W.

Figure 7:
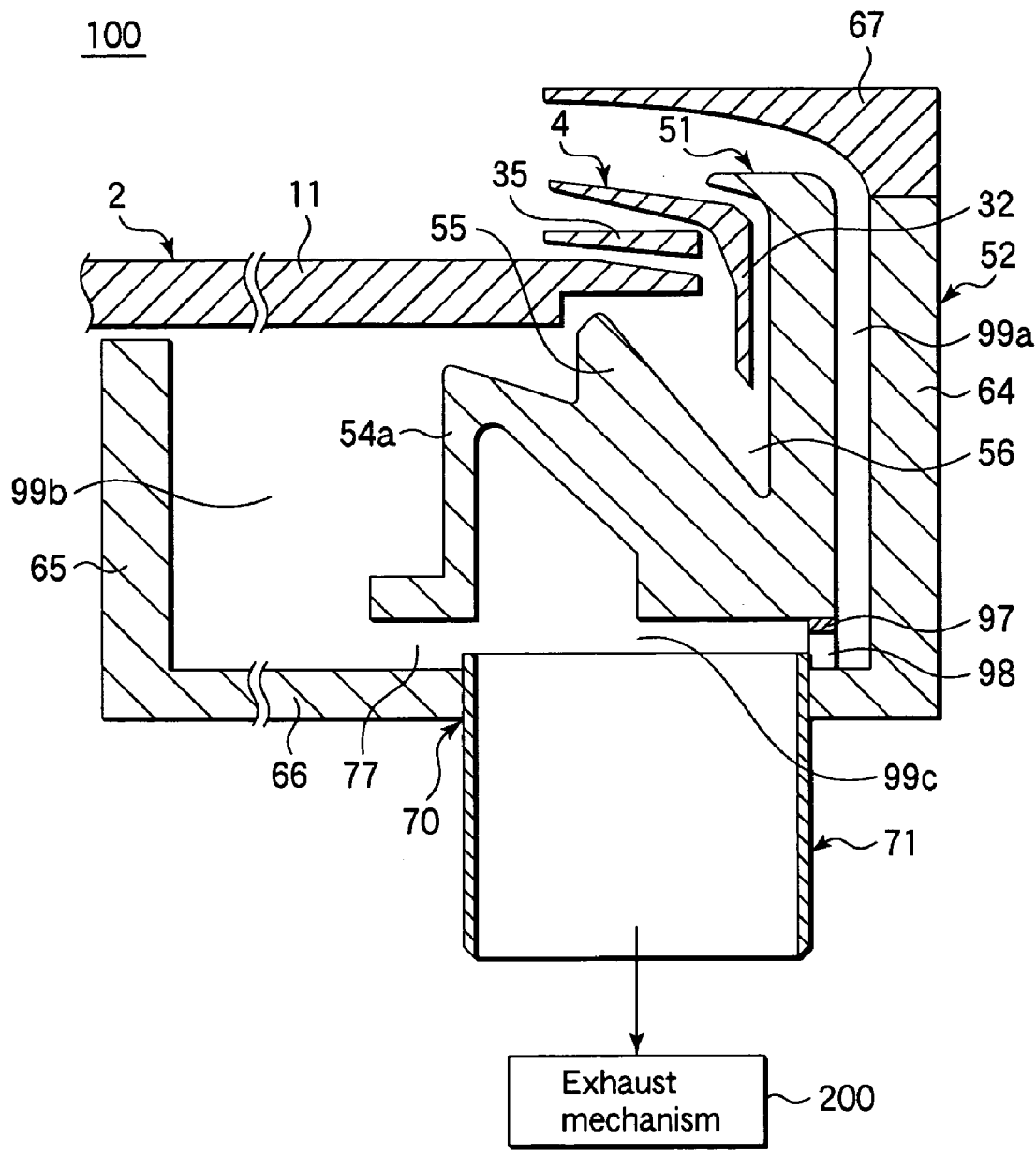
FIG. 7 is an enlarged sectional view showing a portion near the drain cup and exhaust cup.

FIG. 7 is an enlarged sectional view showing a portion near the drain cup 51 and exhaust cup 52.

As shown in FIG. 7, the wafer holding member 2 includes the rotary plate 11 configured to rotate along with a wafer W (not shown in FIG. 7) held thereon in a horizontal state, and the rotary cup 4 is disposed around the rotary plate 11 to surround the wafer W. The rotary cup 4 is configured to rotate along with the rotary plate 11 and includes the wall portion 32 that receives a process liquid thrown off from the wafer W. The exhaust cup 52 is disposed around the rotary cup 4 to surround the rotary cup 4 and rotary plate 11. The exhaust cup 52 includes the bottom wall 66, the annular outer wall 64 disposed along the outer periphery of the bottom wall 66, and the annular inner wall 65 disposed on an inward side from the annular outer wall 64 (along the inner periphery of the bottom wall 66). Inside the exhaust cup 52, the drain cup 51 surrounds the rotary cup 4 and rotary plate 11. A lower annular space 99c is formed between the drain cup 51 and the bottom wall 66 of the exhaust cup 52. An outer annular space 99a is formed between the drain cup 51 and the annular outer wall 64 of the exhaust cup 52. An inner annular space 99b is formed between the drain cup 51 and the annular inner wall 65 of the exhaust cup 52. The drain cup 51 includes the annular liquid receptacle 56 below the wall portion 32 of the rotary cup 4, for receiving process liquid thrown off from the wafer W being rotated. The lower annular space 99c communicates with the exhaust ports 70 each connected through the exhaust tube 71 to an exhaust mechanism 200. The gas-flow adjusting member 97 is disposed between the lower annular space 99c and outer annular space 99a. The gas-flow adjusting member 97 includes a plurality of gas-flow holes 98 that connect the outer annular space 99a to the lower annular space 99c.

Figure 8:
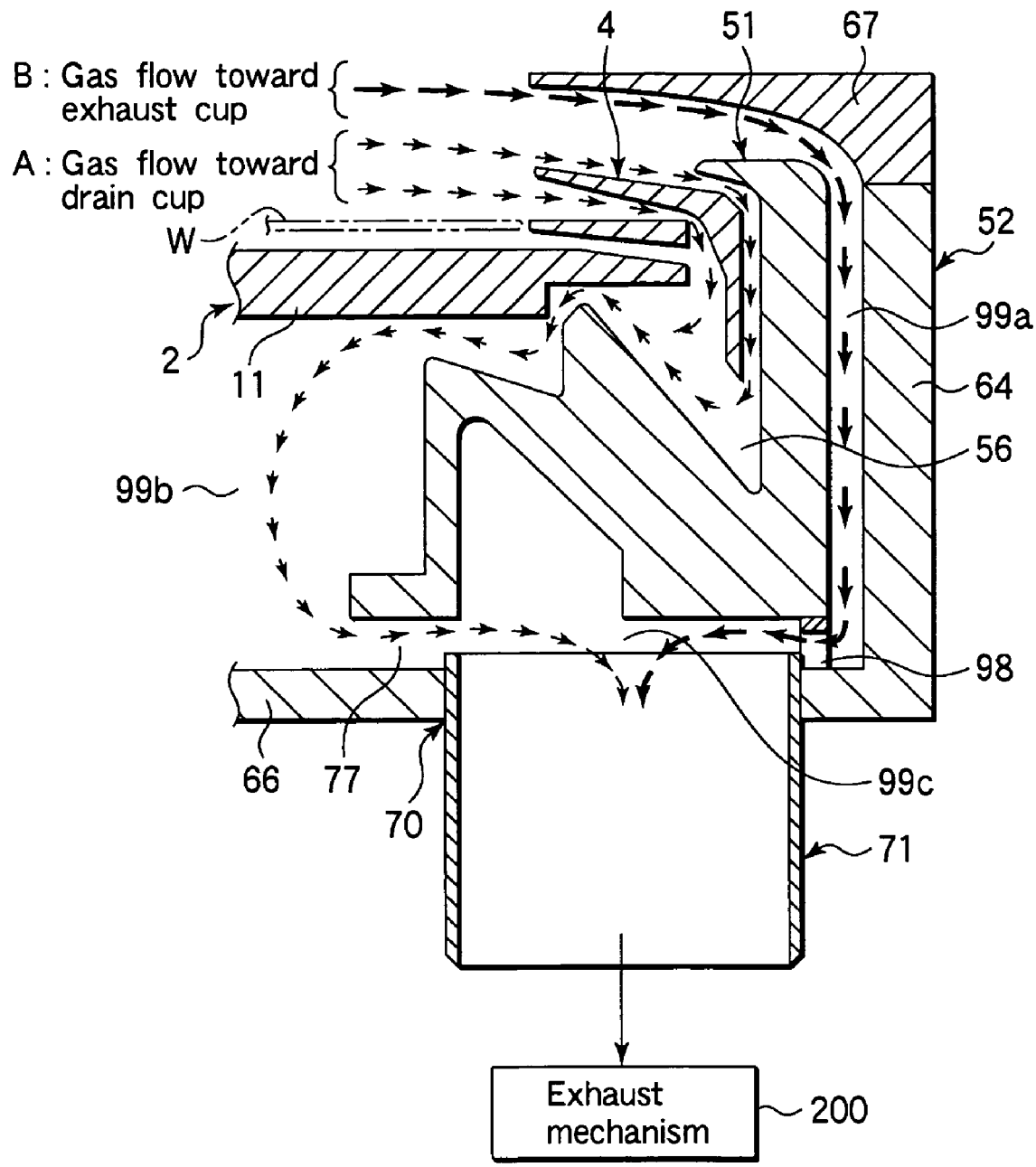
FIG. 8 is a view showing a state of gas flows.

In the processing apparatus 100 including the drain cup 51 and exhaust cup 52 described above, when gas is exhausted by the exhaust mechanism 200, gas flows of different two types, i.e., a gas flow toward the drain cup 51 and a gas flow the exhaust cup 52, are generated. FIG. 8 shows these gas flows.

As shown in FIG. 8, the gas flow A toward the drain cup is generated above the wafer W, and the gas flow B toward the exhaust cup is generated above the gas flow A.

Figure 9A:
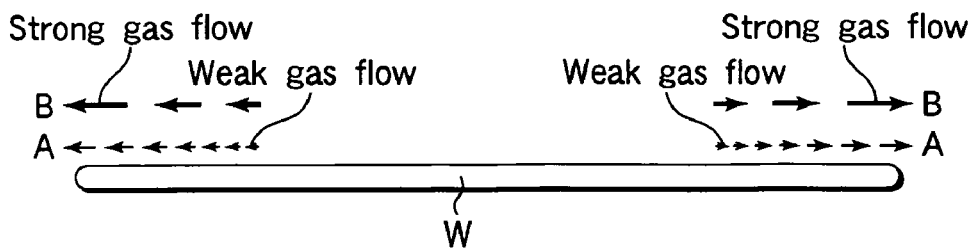
FIGS. 9A to 9D are views showing the mechanism of a sequence of from mist generation to particle remaining.

These two gas flows A and B differ from each other in strength such that the gas flow B toward the exhaust cup is stronger than the gas flow A toward the drain cup. Since the drain cup 51 includes the partition wall 55 and recessed liquid receptacle 56 below the rotary cup 4 and rotary plate 11, the space present along these portions has a more complex shape than the outer annular space 99a that is essentially straight. Accordingly, it is thought that the air resistance of the exhaust passage toward the drain cup is larger, and so the gas flow A toward the drain cup becomes weaker than the gas flow B toward the exhaust cup. FIG. 9A shows gas flows above the wafer W.

Figure 9B:
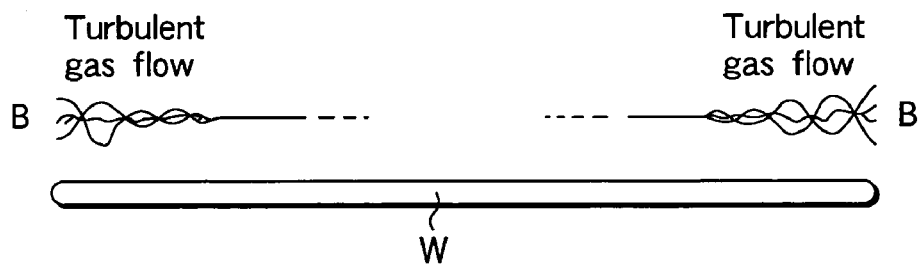
Figure 9C:
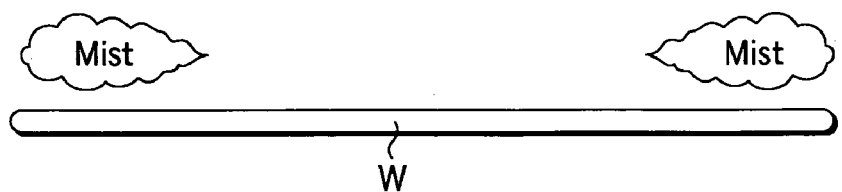
Figure 9D:
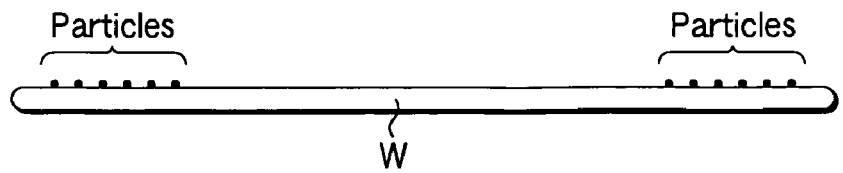

As shown in FIG. 9A, above the periphery of the wafer W, the gas flow A (the gas flow toward the drain cup) is weaker while the gas flow B (the gas flow toward the exhaust cup) is stronger. Expressing in flow velocity, the gas flow A is slower while the gas flow B is faster. If the gas flow B is too fast, the gas flow B can hardly maintain a laminar flow and becomes turbulent, as shown in FIG. 9B. As the gas flow B is turbulent, mist is generated, as shown in FIG. 9C. In this respect, since the gas flow A flowing near the wafer W is weaker, it is difficult to sufficiently exhaust the mist. In order to increase the strength of the gas flow A, the exhaust mechanism may be set to have a higher exhaust power. However, in this case, the strength of the gas flow B is also increased, and the gas flow B thereby becomes much more turbulent. Consequently, as shown in FIG. 9D, particles remain on the periphery of the wafer W, and deteriorate the cleaning effect.

According to an embodiment made in light of this problem, the drain cup 51 and exhaust cup 52 are provided with features as described below.

First Embodiment

Figure 10:
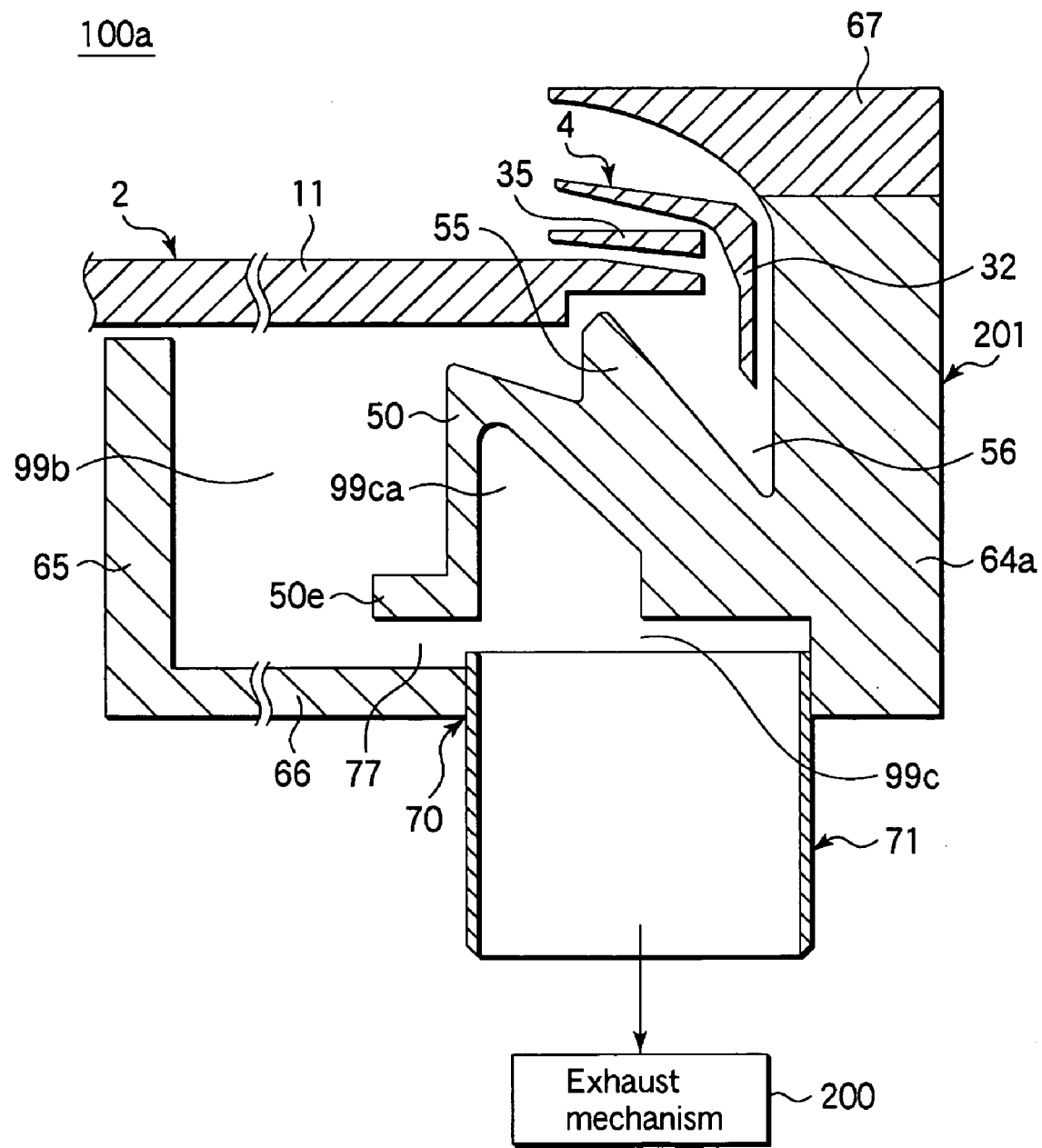
FIG. 10 is a sectional view showing a processing apparatus 100a according to a first embodiment.

FIG. 10 is a sectional view showing a processing apparatus 100a according to a first embodiment.

As shown in FIG. 10, the processing apparatus 100a according to the first embodiment differs from the processing apparatus 100 shown in FIG. 7 in that the drain cup and exhaust cup are integrated as an exhaust and drain cup 201. In this case, the outer annular space 99a of the processing apparatus 100 shown in FIG. 7 is excluded, and thus there is no exhaust passage through the outer annular space 99a. Except for the matter described above, the processing apparatus 100a shown in FIG. 10 is the same as the processing apparatus 100 shown in FIG. 7.

Specifically, the exhaust and drain cup 201 includes an annular outer wall 64a, an annular inner wall 65, a bottom wall 66, and an annular built-in frame 50 forming a liquid receptacle 56 inside the space surrounded by the walls. The exhaust and drain cup 201 may be prepared as a structure in which all the parts 64a, 65, 66, and 50 described above are integrally molded, or some of the parts, such as the annular outer wall 64a and built-in frame 50, are integrally molded. Alternatively, the exhaust and drain cup 201 may be prepared as a structure assembled from the respective parts separately formed. An inner annular space 99b is formed between the annular inner wall 65 and built-in frame 50, and a lower annular space 99c is formed between the bottom wall 66 and built-in frame 50. The built-in frame 50 is supported as a cantilever by the annular outer wall 64a. A gap 77 is formed between the inner free end 50e of the built-in frame 50 and the bottom wall 66 to connect the inner annular space 99b to the lower annular space 99c all over an annular direction.

An annular groove 99ca is formed in the lower side of the built-in frame 50 and serves as a buffer space portion of the lower annular space 99c. The lower annular space 99c is connected to an exhaust mechanism 200 through an exhaust port or exhaust ports 70 formed at least at one position directly below the annular groove 99ca.

The processing apparatus 100a according to the first embodiment includes an integrated form of the drain cup and exhaust cup, and thus a gas flow toward the exhaust and drain cup 201 is the only exhaust gas flow generated by the exhaust mechanism 200. In other words, the two gas flows A and B different from each other in strength shown in FIG. 8 are not generated. Consequently, mist generation due to, e.g., the mechanism shown in FIGS. 9A to 9D is suppressed.

As described above, in the processing apparatus 100a according to the first embodiment, since mist can be hardly generated above the wafer W, essentially no particles remain on the periphery of the wafer W, and so the cleaning effect is improved after cleaning of the wafer W, for example.

In the first embodiment, the exhaust ports 70 are formed below the lower annular space 99c, but the exhaust ports 70 may be formed below the inner annular space 99b while the lower annular space 99c is closed. In this case, the inner annular space 99b is directly exhausted by the exhaust mechanism 200.

Second Embodiment

Figure 11:
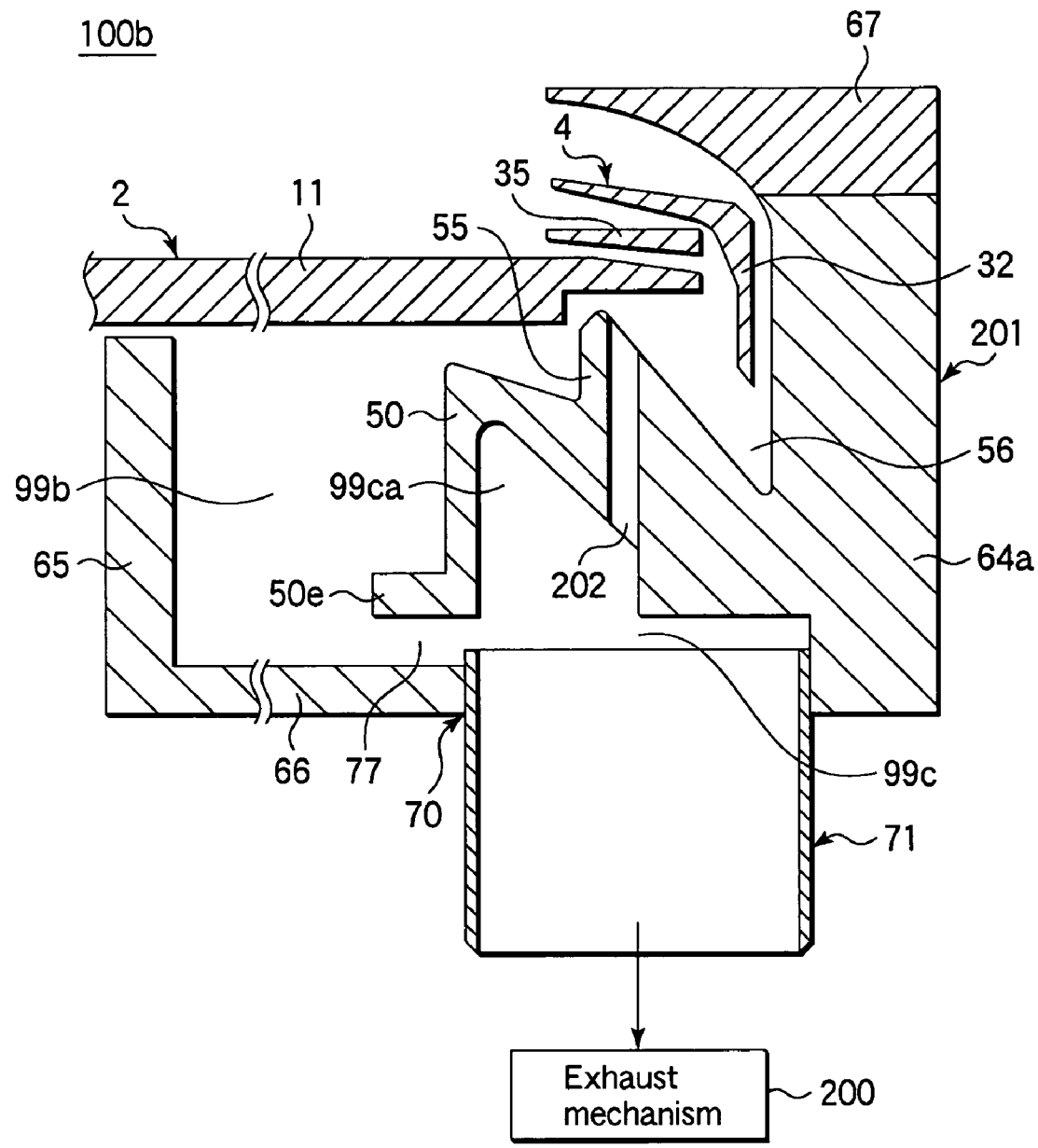
FIG. 11 is a sectional view showing a processing apparatus 100b according to a second embodiment.

FIG. 11 is a sectional view showing a processing apparatus 100b according to a second embodiment.

As shown in FIG. 11, the processing apparatus 100b according to the second embodiment differs from the processing apparatus 100a shown in FIG. 10 in that at least one ventilation hole 202 is formed above the lower annular space 99c and opened to a position adjacent to the rotary plate 11 of the wafer holding member 2. Except for the matter described above, the processing apparatus 100b shown in FIG. 11 is the same as the processing apparatus 100a shown in FIG. 10.

Specifically, this at least one ventilation hole 202 is formed through a portion of the built-in frame 50 off the liquid receptacle 56 such that a position adjacent to the wafer holding member communicates with the lower annular space 99c. Further, this at least one ventilation hole 202 is opened to the annular groove 99ca formed in the lower side of the built-in frame 50 and serving as a buffer space portion of the lower annular space 99c.

As in the processing apparatus 100a, since the processing apparatus 100b according to the second embodiment also includes an integrated form of the drain cup and exhaust cup, mist is prevented from being generated above the wafer W.

Figure 12:
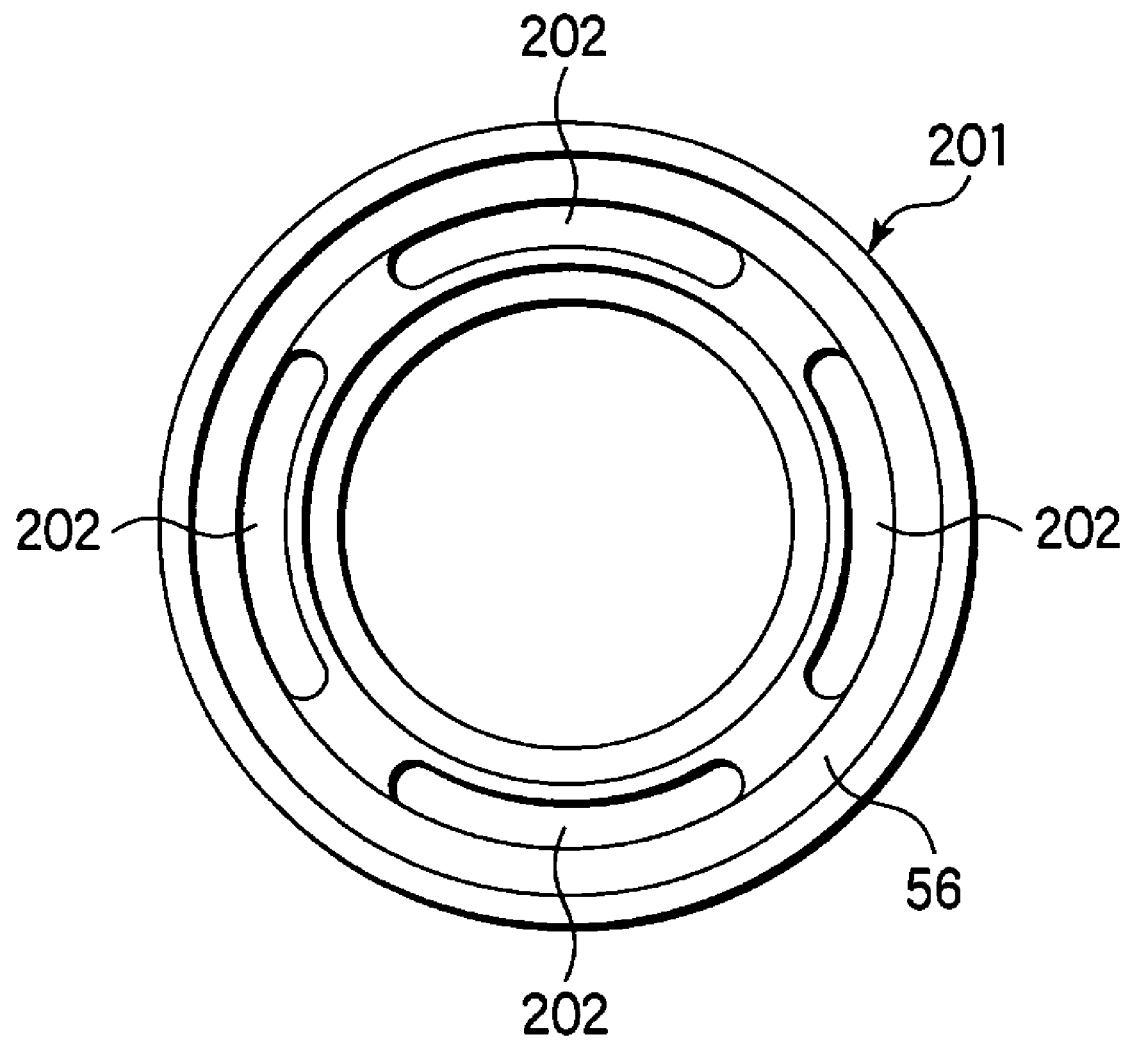
FIG. 12 is a plan view showing an exhaust and drain cup.

Further, in the processing apparatus 100b according to the second embodiment, since the ventilation hole 202 is formed above the lower annular space 99c, the exhaust passage extending from below the rotary plate 11 to the exhaust tube is larger than that of the processing apparatus 100a according to the first embodiment. This larger exhaust passage allows gas to be more forcibly exhausted from the front surface or the front and back surfaces of the wafer W, so that the cleaning effect is further improved.

Where a plurality of ventilation holes 202 are formed, as shown in the plan view of FIG. 12, the ventilation holes 202 are preferably arrayed in an annular direction above the lower annular space 99c, so that gas flows are uniformly generated.

Third Embodiment

Figure 13:
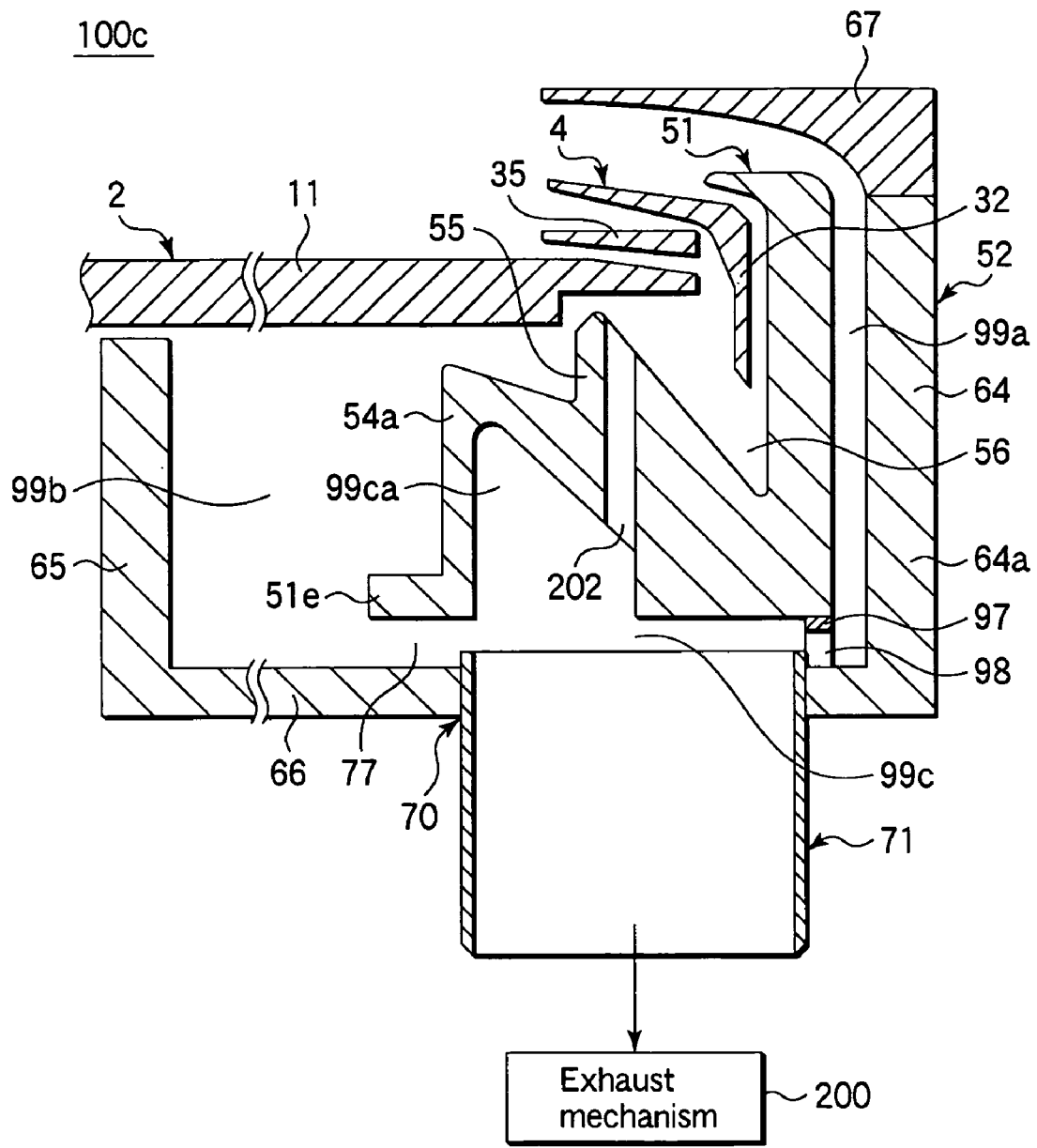
FIG. 13 is a sectional view showing a processing apparatus 100c according to a third embodiment.

FIG. 13 is a sectional view showing a processing apparatus 100c according to a third embodiment.

As shown in FIG. 13, the processing apparatus 100c according to the third embodiment differs from the processing apparatus 100 shown in FIG. 7 in that at least one ventilation hole 202 is formed above the lower annular space 99c, as in the processing apparatus 100b according to the second embodiment. Where a plurality of ventilation holes 202 are formed, the ventilation holes 202 are preferably arrayed in an annular direction above the lower annular space 99c, as shown with reference to the second embodiment. Except for the matter described above, the processing apparatus 100c shown in FIG. 13 is the same as the processing apparatus 100 shown in FIG. 7.

Specifically, an annular groove 99ca is formed in the lower side of the drain cup 51 and serves as a buffer space portion of the lower annular space 99c. The lower annular space 99c is connected to an exhaust mechanism 200 through an exhaust port or exhaust ports 70 formed at least at one position directly below the annular groove 99ca. A gap 77 is formed between the inner free end 51e of the drain cup 51 and the bottom wall 66 to connect the inner annular space 99b to the lower annular space 99c all over an annular direction.

This at least one ventilation hole 202 is formed through a portion of the drain cup 51 off the liquid receptacle 56 such that a position adjacent to the wafer holding member 2 communicates with the lower annular space 99c. Further, this at least one ventilation hole 202 is opened to the annular groove 99ca formed in the lower side of the drain cup 51 and serving as a buffer space portion of the lower annular space 99c.

The processing apparatus 100c according to the third embodiment includes the exhaust cup 52 that defines the outer annular space 99a, and so the two gas flows A and B shown in FIG. 8 are generated toward the drain cup 51 and the exhaust cup 52, respectively, as in the processing apparatus 100 shown in FIG. 7.

However, since the ventilation hole 202 is formed above the lower annular space 99c, the exhaust passage extending from below the rotary plate 11 to the exhaust tube is larger than that of the processing apparatus 100 shown in FIG. 7. In this case, the gas flow A toward the drain cup 51 is made stronger while the gas flow B toward the exhaust cup 52 is made weaker. Consequently, the difference in strength between the gas flow A and gas flow B can be smaller than that obtained by the processing apparatus 100 shown in FIG. 7. If necessary, the difference in strength between the gas flow A and gas flow B can be set to be zero. In this respect, the gas-flow adjusting member 92 can be set to apply a predetermined gas-flow resistance to the exhaust gas flowing through the outer annular space 99a, so that the imbalance in the gas-flow resistance is cancelled between the route passing through the outer annular space 99a and the route passing through the inner annular space 99b.

Accordingly, even where both of the gas flows A and B are generated, mist generation due to, e.g., the mechanism shown in FIGS. 9A to 9D is suppressed, and particles are thereby prevented from remaining on the wafer W.

As described above, the processing apparatus 100c according to the third embodiment also improves the cleaning effect.

Further, the processing apparatus 100c according to the third embodiment can be used, as follows as well.

Figure 14:
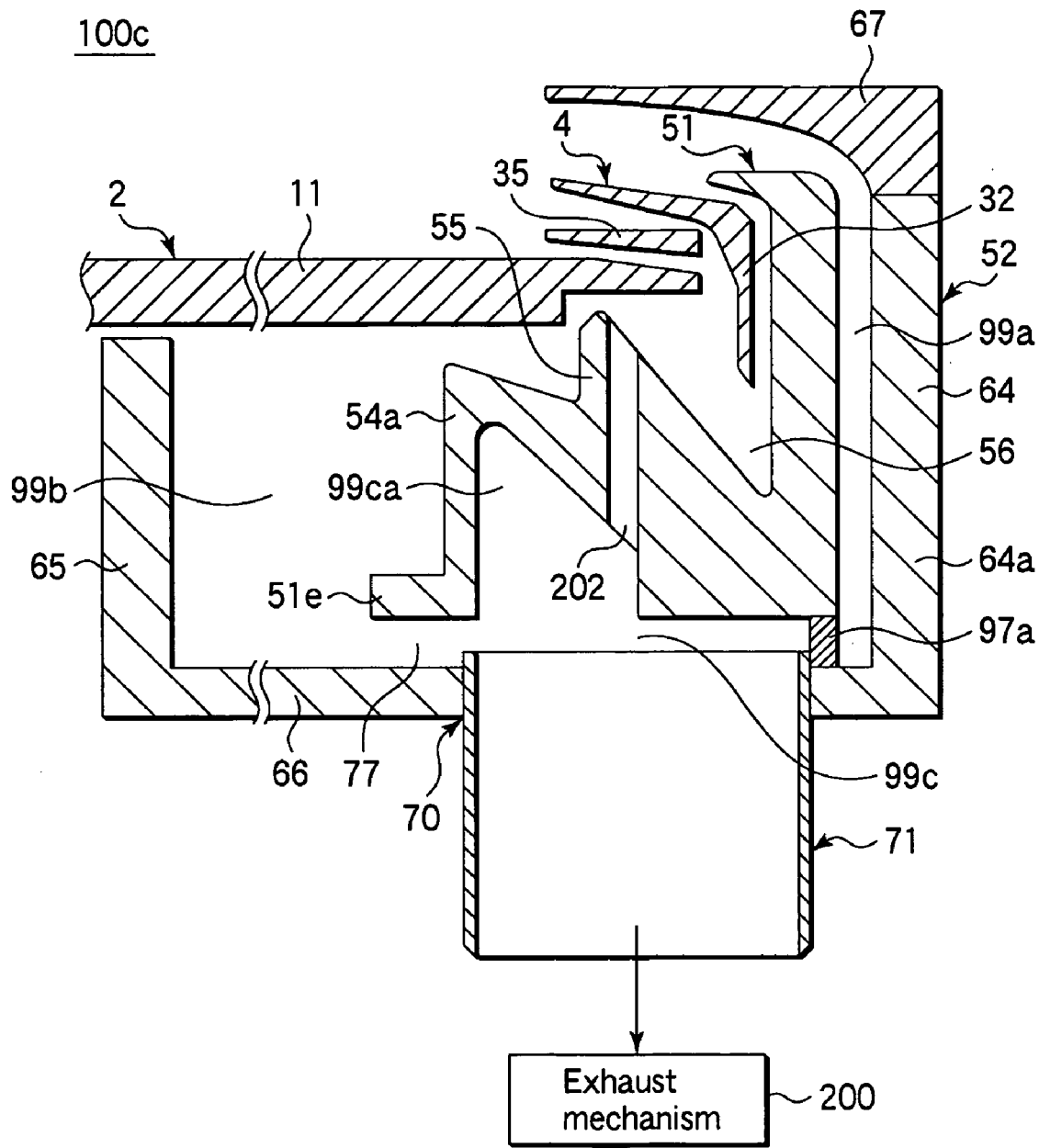
FIG. 14 is a sectional view showing an example of how to use the processing apparatus 100c.

FIG. 14 is a sectional view showing an example of how to use the processing apparatus 100c. This is an example made in light of a feature in that the gas-flow adjusting member 97 is replaceable.

As shown in FIG. 14, a gas-flow adjusting member 97a is interposed between the outer annular space 99a and lower annular space 99c. The gas-flow adjusting member 97 shown in FIG. 13 has a plurality of gas-flow holes 98 that connect the outer annular space 99a to the lower annular space 99c. However, the gas-flow adjusting member 97a used in this example has no gas-flow holes 98. Where the gas-flow adjusting member 97a having no gas-flow holes 98 is used, the outer annular space 99a is blocked off from the lower annular space 99c. Since the lower annular space 99c is connected to the exhaust mechanism 200, and the outer annular space 99a is blocked off from the lower annular space 99c, only the gas flow A toward the drain cup 51 shown in FIG. 8 is generated without the gas flow B toward the exhaust cup 52.

As described above, where the gas-flow adjusting member 97a is used to block off the outer annular space 99a from the lower annular space 99c, only the gas flow A toward the drain cup 51 is generated to prevent mist generation above the wafer W, as in the processing apparatus 100a according to the first embodiment.

Where the gas-flow adjusting members 97 are 97a are replaceable, the gas-flow adjusting member 97 having gas-flow holes and the gas-flow adjusting member 97a having no gas-flow holes may be replaced with each other to selectively set two states where the outer annular space 99a communicates with the lower annular space 99c and where the outer annular space 99a is blocked off from the lower annular space 99c.

Figure 15:
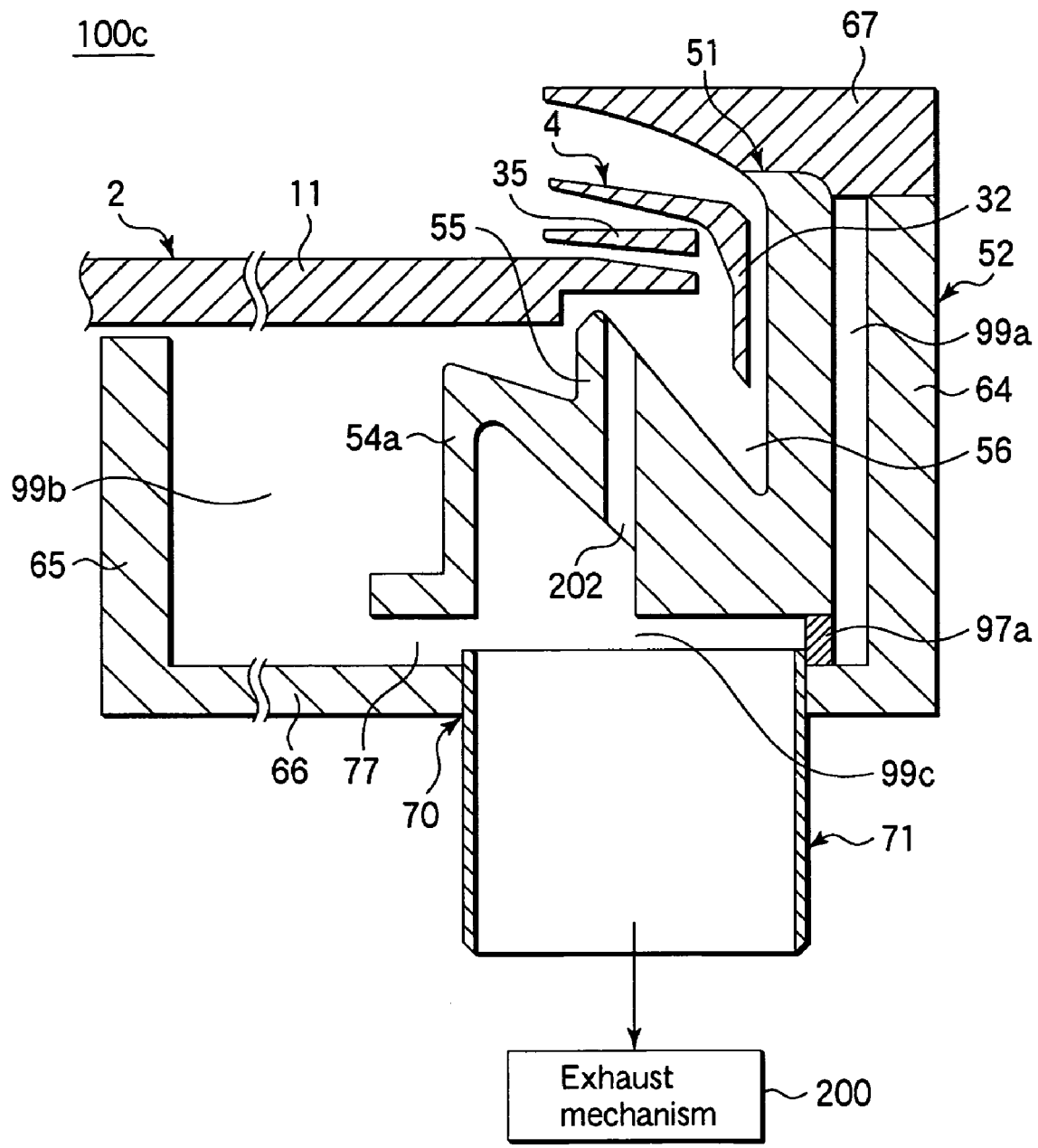
FIG. 15 is a sectional view showing another example of how to use the processing apparatus 100c.

FIG. 15 is a sectional view showing another example of how to use the processing apparatus 100c. This is an example made in light of a feature in that the top wall 67 is replaceable.

As shown in FIG. 15, the top wall 67 is disposed on top of the annular outer wall 64. In this example, the top wall 67 is arranged not only to cover the upper side of the drain cup 51 but also to cover and thereby close the outer annular space 99a.

As in this case, the outer annular space 99a can be closed by use of the top wall 67, so that only the gas flow A toward the drain cup 51 is generated to prevent mist generation above the wafer W, as in the processing apparatus 100a according to the first embodiment.

Where the gas-flow adjusting member 97a having no gas-flow holes is used, if the outer annular space 99a is exposed to the outside, the outer annular space 99a may be contaminated. In order to prevent such contamination, the top wall 67 is preferably arranged to close the outer annular space 99a, as in this example.

The present invention has been described with reference to embodiments, but the present invention is not limited to the embodiments described above and it may be modified in various manners. For example, the embodiments described above are exemplified by a cleaning processing apparatus for cleaning the front and back surfaces of a wafer. However, the present invention may be applied to a cleaning processing apparatus for cleaning only one of the front and back surfaces of a wafer. Further, in place of a cleaning process, the present invention may be applied to a liquid processing apparatus for performing another liquid process. In the embodiments described above, the target substrate is exemplified by a semiconductor wafer, but the present invention may be applied to another substrate, such as a substrate for flat panel display devices (FPD), a representative of which is a glass substrate for liquid crystal display devices (LCD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus comprising:
    a substrate holding member configured to rotate along with a substrate held thereon in a horizontal state;
    a rotation mechanism configured to rotate the substrate holding member;
    a process liquid supply mechanism configured to supply a process liquid onto the substrate;
    a rotary cup disposed outside the substrate holding member to surround the substrate held on the substrate holding member and to rotate along with the substrate holding member, and having a wall portion that receives the process liquid thrown off from the substrate being rotated;
    an exhaust and drain cup disposed outside the rotary cup to surround the rotary cup and the substrate holding member, and including an annular liquid receptacle that receives the process liquid thrown off from the substrate being rotated and an inner annular space formed on an inward side from the annular liquid receptacle; and
    an exhaust mechanism connected to the inner annular space of the exhaust and drain cup, wherein
    the exhaust and drain cup further includes a lower annular space present directly below the liquid receptacle and defined by an inner periphery connected to the inner annular space and an outer periphery completely closed,
    the exhaust mechanism is connected through the lower annular space to the inner annular space,
    the exhaust and drain cup includes an annular outer wall, an annular inner wall, a bottom wall, and a built-in frame forming the liquid receptacle inside a space surrounded by the walls, such that the inner annular space is formed between the annular inner wall and the built-in frame, and the lower annular space is formed between the bottom wall and the built-in frame, and
    a gap is formed between an inner end of the built-in frame and the bottom wall and sets the inner annular space to communicate with the lower annular space.

2. The substrate processing apparatus according to claim 1, wherein the built-in frame has an annular groove formed in a lower side thereof and serving as a buffer space portion of the lower annular space.

3. The substrate processing apparatus according to claim 2, wherein the lower annular space is connected to the exhaust mechanism through at least one exhaust port formed directly below the annular groove.

4. The substrate processing apparatus according to claim 1, wherein the built-in frame is supported as a cantilever by the annular outer wall.

5. The substrate processing apparatus according to claim 4, wherein the inner end of the built-in frame is an inner free end and the gap sets the inner annular space to communicate with the lower annular space all over an annular direction.

6. The substrate processing apparatus according to claim 1, wherein the liquid receptacle is connected to a drain tube through a drain port formed on the liquid receptacle.

* * * * *